US008083859B2

(12) United States Patent
Bangert et al.

(10) Patent No.: US 8,083,859 B2
(45) Date of Patent: Dec. 27, 2011

(54) ARRANGEMENT AND METHOD FOR REMOVING ALKALI- OR ALKALINE EARTH-METALS FROM A VACUUM COATING CHAMBER

(75) Inventors: Stefan Bangert, Steinau (DE); Jose Manuel Dieguez-Campo, Hanau (DE); Michael Koenig, Frankfurt (DE); Nety M. Krishna, Sunnyvale, CA (US); Byung-Sung Leo Kwak, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 240 days.

(21) Appl. No.: 12/130,572

(22) Filed: May 30, 2008

(65) Prior Publication Data

US 2009/0293909 A1    Dec. 3, 2009

(51) Int. Cl.
*B08B 7/00*    (2006.01)
*B08B 5/04*    (2006.01)
(52) U.S. Cl. .................................. 134/4; 134/1; 134/21
(58) Field of Classification Search .................. 134/1, 4, 134/21
See application file for complete search history.

(56) References Cited

U.S. PATENT DOCUMENTS

| 5,055,169 | A | 10/1991 | Hock | |
| 2002/0157945 | A1* | 10/2002 | Szczyrbowski et al. . | 204/298.03 |
| 2002/0185067 | A1 | 12/2002 | Upham | |
| 2002/0190024 | A1* | 12/2002 | Eguchi et al. .................... | 216/37 |
| 2005/0244715 | A1* | 11/2005 | Cho et al. ........................ | 429/246 |
| 2006/0138656 | A1* | 6/2006 | Stegamat et al. .............. | 257/734 |
| 2006/0162861 | A1* | 7/2006 | O'Meara et al. .......... | 156/345.24 |
| 2007/0163617 | A1* | 7/2007 | Ozaki et al. .................... | 134/1.1 |
| 2007/0254096 | A1* | 11/2007 | Hepper et al. ................. | 427/237 |
| 2008/0111104 | A1* | 5/2008 | Lefenfeld et al. ........... | 252/182.1 |
| 2008/0182427 | A1* | 7/2008 | Oberbeck et al. ............. | 438/785 |

FOREIGN PATENT DOCUMENTS

| DE | 103 382 75 A1 | 3/2005 |
| EP | 0 441 368 A1 | 8/1991 |
| EP | 1 612 857 A1 | 1/2006 |
| JP | 59060866 A2 | 4/1984 |
| JP | 2002206160 | 7/2002 |
| JP | 2003 007290 A2 | 1/2003 |
| JP | 2003 229365 A2 | 8/2003 |
| JP | 2003 234100 A2 | 8/2003 |
| JP | 2007 207663 A2 | 8/2007 |
| WO | WO 2005081302 A1 * | 9/2005 |

* cited by examiner

*Primary Examiner* — Michael Kornakov
*Assistant Examiner* — Nicole Blan
(74) *Attorney, Agent, or Firm* — Cooley LLP

(57) ABSTRACT

The invention relates to a cleaning method in which from a vacuum coating chamber (3) of a coating installation (1) for the coating of substrates (2) with alkali- or alkaline earth-metals, residues of alkali- or alkaline earth-metals are removed. For this purpose into the chamber (3) a gas from the group of $N_2$, $O_2$ or air is introduced, which reacts with the alkali- or alkaline earth-metals to form the corresponding solid compounds. Water can additionally be introduced into the vacuum coating chamber (3).
After the alkali- or alkaline earth-metals have reacted with the gas, the corresponding solid compound is removed from the vacuum coating chamber.

25 Claims, 1 Drawing Sheet

ARRANGEMENT AND METHOD FOR REMOVING ALKALI- OR ALKALINE EARTH-METALS FROM A VACUUM COATING CHAMBER

FIELD OF THE INVENTION

The invention relates to an arrangement and a method for removing metals from a vacuum coating chamber.

BACKGROUND OF THE INVENTION

Modern lithium batteries are, as a rule, produced in a vacuum chamber, wherein a substrate is provided with a lithium layer. The lithium layer is formed, for example, through the deposition on the substrate of lithium in the vapor state. Since lithium is highly reactive, contact by the operating personnel after opening the vacuum chamber must be avoided. Even if the excess lithium has been pumped out of the vacuum chamber, it is still possible for lithium particles deposited on the inner wall of the vacuum chamber or on facings and/or maskings to harm the operating personnel.

Methods for the production of lithium batteries are already known in which lithium is converted in a vacuum chamber into vapor, which is subsequently deposited on a substrate (JP 59-060866, JP 2003-007290, JP 2003-234100, JP 2007-207663). Nothing is found in these publications regarding the cleaning of the vacuum chamber.

It is further known to eliminate undesirable depositions on the inside of a coating installation by means of a cleaning gas (JP 2003-229365). However, lithium or alkali metals are herein not listed.

Furthermore, cleaning a process chamber by means of a gas containing $O_2$ is known (US 2007/0163617 A1). Herein the cleaning is carried out at increased temperature and under vacuum. The gas preferably also contains H radicals, since the cleaning process can also be carried out by means of a plasma. However, the walls of the process chamber are cleaned of tungsten and not of lithium or another aggressive material.

A further method for cleaning coating chambers is disclosed in DE 103 38 275 A1. In this method the process chamber is flushed with a conditioned purge gas before a coating process. The purge gas is preferably comprised of $O_2$ and $N_2$ with a humidity value of maximally 30%. The coating chamber is cleaned before the coating process and the coating material is not lithium.

US 2002/0185067 A1 discloses a device and a method for the in situ cleaning of a throttle valve in a CVD system. Here a cleaning gas is introduced which can comprise $F_2$, $C_2F_6$, $O_2$ or $NF_3$. Lithium is not discussed.

A cleaning process for a coating chamber is furthermore known in which inter alia $N_2$ and $O_2$ are employed as cleaning gases (EP 1 612 857 A1). These gases are converted to plasma and subsequently serve for cleaning the inner wall of a CVD chamber. High frequency is utilized for the generation of the plasma. However, not Li, but rather $Si_3N_4$ or $SiO_2$ are removed.

EP 0 441 368 A discloses a device and a method for eliminating excess material from a PVD chamber. During a cleaning cycle a vacuum is generated in the PVD chamber and a gas mixture with reactive gas is introduced into the PVD chamber. The reactive gas is herein activated through plasma discharge. The objects of the cleaning are also screenings. The eliminated material is Ti, W or Al, not however Li.

The invention addresses the problem of cleaning such parts of a vacuum coating chamber which during the production of thin-film batteries are unintentionally coated, for example maskings, metal lining sheets and the like.

SUMMARY OF THE INVENTION

The advantage attained with the invention comprises in particular that unintentionally coated parts are cleaned in simple manner and the cycle times or service times are shortened. Since the cleaning can also be carried out cyclically, it is possible to operate a coating installation without interruption.

The invention consequently relates to a cleaning method in which from a vacuum coating chamber of a coating installation for the coating of substrates with alkali- or alkaline earth-metals, residues of alkali or alkaline earth-metals are removed. For this purpose into the chamber a gas from the group of $N_2$, $O_2$ or air is introduced which reacts with the alkali- or alkaline earth-metals to form the corresponding solid compounds. Water can still also be additionally introduced into the vacuum coating chamber.

After the alkali- or alkaline earth-metals have reacted with the gas, the corresponding solid compound is removed from the vacuum coating chamber.

BRIEF DESCRIPTION OF THE DRAWINGS

An embodiment example of the invention is shown in the drawing and will be described in further detail in the following. In the drawing depict.

DETAILED DESCRIPTION

Figure 1:
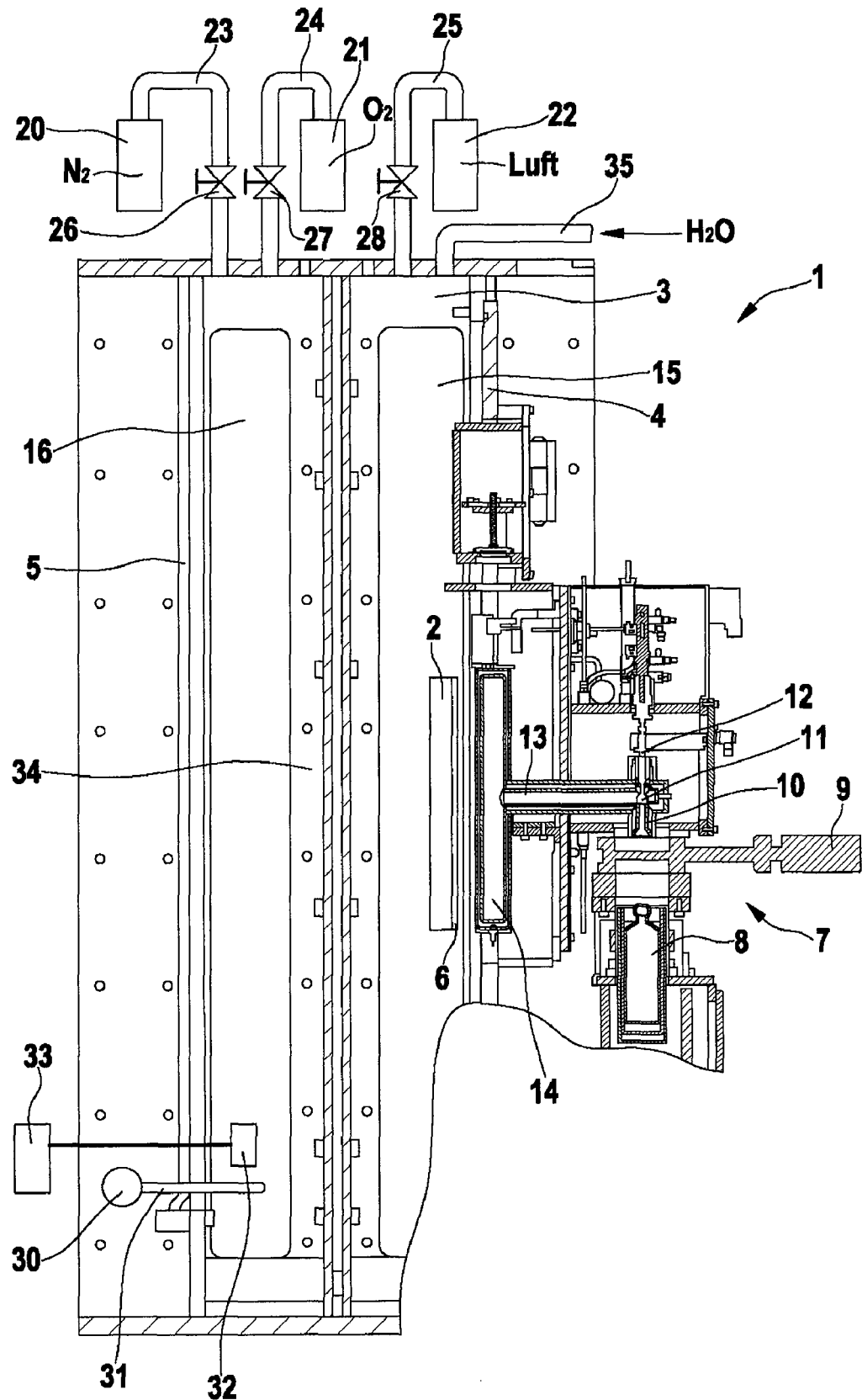
FIG. 1 a vacuum chamber for coating a substrate by means of a vaporized material.

A coating installation 1, in which a substrate 2 can be coated, is shown in FIG. 1 in sectional view. This coating installation 1 includes a vacuum coating chamber 3, of which two side-walls 4, 5 are evident. Masking 6 is disposed between the substrate 2 and a vapor feed system 7, which comprises a vaporizer crucible 8, a valve 9 and a vapor inlet 10 to 13. The end of the vapor inlet is formed by a linear distributor 14 implemented as a vertically oriented tube with linearly disposed openings. These openings are located opposite the masking 6. By 15, 16 are denoted covers in the vacuum chamber 3.

In the vaporizer crucible 8 is melted, for example, lithium for the production of thin-film lithium batteries and vaporized. Instead of lithium, another reactive metal from the group of alkali- and alkaline earth-metals, for example cesium, could also be utilized.

The vaporized material arrives via the vapor inlet 10 to 13 at the distributor 14 and from here, via the masking 6, which does not need to be provided in every case, at the substrate 2. In addition, the vaporized material also reaches the covers 15, 16 and other parts which it is not intended to reach.

When the coating of substrate 2 is completed, the unintentionally coated parts must be freed of the coating in order for the operating personnel not to be harmed by the reactive lithium when opening the vacuum chamber 3 and removing the coated substrate 2.

However, in order for a person not to come into contact with the lithium or other alkaline earth- or alkali-metals, these metals must be removed from the installation. The removal of these reactive metals from the installation takes place after the coating process has been terminated and the substrates have been transferred from the coating installation 1 via a vacuum lock, not shown in FIG. 1. After the substrates have been removed from the coating installation 1, one or several gases are introduced into the vacuum chamber 3 before the opening the vacuum chamber 3.

For this purpose, outside of vacuum chamber 3 several gas containers 20, 21, 22 are provided which contain the gases $N_2$, $O_2$ or air. Activation of the gases is not absolutely required. These gas tanks 20, 21, 22 are connected via supply pipes 23, 24, 25 and valves 26, 27, 28 with the vacuum chamber 3. If $N_2$ is introduced into the vacuum chamber 3, the $N_2$ molecules combine with lithium according to the equation $6\,Li+N_2 \to 2\,Li_3N$. This end product is a solid which falls from the vertical surfaces to the bottom of the vacuum chamber 3 or adheres at the site of the reaction.

If $O_2$ is introduced into the vacuum chamber 3, based on the expression $4\,Li+O_2$ the colorless powdery solid compound $Li_2O$ is formed, which is also nontoxic and falls from vertical parts.

It is understood that instead of pure oxygen, air can also be introduced into the vacuum chamber 3. This air can herein be enriched with $O_2$. Since air contains both nitrogen as well as also oxygen, lithium consequently reacts with the nitrogen as well as also with the oxygen. It is here advantageous if the air has a certain humidity. To this end the air can additionally be enriched with water. If there is also water contained in the air, the following reaction takes place:

$$Li+H_2O \to LiOH + \tfrac{1}{2}H_2.$$

When air and water are introduced, in addition to $Li_3N$ and $Li_2O$, $LiOH$ and $Li_2CO_3$ are also formed.

For instance, $Li_2CO_3$ is formed through the following reaction: $2\,LiOH+CO_2 \to Li_2CO_3+H_2O$.

At high temperatures $Li_2CO_3$ breaks down again into $Li_2O$ and $CO_2$. The same applies also to $LiOH$ which breaks down into $Li_2O$ and $H_2O$. The lithium compounds must in every case be nontoxic and remain stable in air.

Since the reactions of $H_2O$, $O_2$ and $N_2$ are exothermic, it is advantageous to cool the vacuum chamber 3. This can be carried out by means of a cooling system, not depicted in FIG. 1.

In principle, the metal Li, or also the other alkali- and alkaline earth-metals, can be made to react with other substances, such as, for example, with halogens or hydrogen compounds of these halogens.

However, since these halogens or halogen compounds are highly reactive and can also chemically attack the chamber, it is necessary when employing these compounds to build the chamber of a material that is chemically inert relative to these compounds.

Although activation of the gases is not absolutely required, it is nevertheless advantageous to carry out the reaction at increased temperatures. A temperature in the range from 30° C. up to 200° C. can be selected, at which the reaction is started. It is obvious that at higher temperatures the reaction proceeds faster. It is of advantage if the reaction takes place at a pressure of up to 100 mbar. The choice of temperature as well as of pressure depends substantially on the design of the vacuum chamber 3. If only pure oxygen is utilized as the gas, the temperature can be, for example, 80° C. and the pressure of the oxygen 100 mbar. This ensures optimal reaction conditions.

It is advantageous if during the cleaning process the reaction is monitored by means of a gas sensor 32. A gas sensor 32 to be considered is, for example, a mass spectrometer, a lambda probe or an IR or NIR spectrometer. Via these measuring devices the gas composition can be determined during the process. If a lambda probe is employed, oxygen is preferably added to the gas or gas mixture. In this case the oxygen content can be determined during the process. As long as there is still lithium in the chamber and reacts with the gases, the concentration of the reactive gases is below the concentration of the gases before their introduction into the vacuum chamber 3 vitiated with lithium. As soon as the lithium has reacted with the gases, the concentration of the gases reaches the starting value again. This indicates that the reaction process has been completed. The gas composition, which had been determined by means of the gas sensor 32, is supplied to an evaluation instrument 33. When the process is completed, by means of a pump 30 and an extraction fitting 31 the powder on the bottom of the vacuum chamber 3 can be suctioned out. It is also possible to vent the vacuum chamber 3 and subsequently to remove the powder by means of a dust extractor. It is herein advantageous to remove the lithium salt adhering on the walls of the vacuum chamber 3 by means of ultrasound such that it falls to the bottom. This facilitates the cleaning work considerably. By setting parameters such as, for example, pressure, temperature or the moisture content in the form of water in the gas or the gas mixture, the reaction with the lithium can be accelerated. In order to enrich gases with moisture, water is introduced into the vacuum chamber 3 via a feed pipe 35.

Whether the lithium salts remain adhered to the surface after the cleaning process or spall off and consequently fall to the bottom of the vacuum chamber 3 depends substantially on the layer thicknesses of the formed lithium salts. If the lithium layers formed in the coating reaction are very thin, salts with a very small grain diameter are formed in the cleaning process. Such lithium layers remain preferably well adhered on the walls of the vacuum chamber 3. If during the coating process thick lithium layers have been formed on the walls of the vacuum chamber, layers are formed in the cleaning reaction with the gases, which layers are under mechanical stress, which can lead to the spalling of the coating. For this reason it can be advantageous to remove the salt residues still adhering on the walls of the vacuum chamber 3 by means of ultrasound.

What is claimed is:

1. Method for removing alkali- or alkaline earth-metals from a vacuum coating chamber of a coating installation, characterized by the following steps:
   a) the vacuum coating chamber is set under vacuum after the coating process has been completed and substrates have been removed from the coating chamber,
   b) then a gas selected from the group consisting of $N_2$, $O_2$ and air is introduced into the vacuum coating chamber such that the gas reacts with the alkali- or alkaline earth-metals in the vacuum coating chamber and forms a solid compound, and
   c) the solid compound is removed in its solid state from the vacuum coating chamber.

2. Method as claimed in claim 1, characterized in that the metal is lithium.

3. Method as claimed in claim 1, characterized in that $H_2O$ is additionally introduced into the vacuum coating chamber.

4. Method as claimed in claim 1, characterized in that the air is enriched with $O_2$.

5. Method as claimed in claim 1, characterized in that the gas content during the reaction is determined by means of a gas sensor.

6. Method as claimed in claim 5, characterized in that the gas content is determined by means of a mass spectrometer.

7. Method as claimed in claim 5, characterized in that the oxygen content is determined by means of a lambda probe.

8. Method as claimed in claim 5, characterized in that the gas content is determined by means of an IR or NIR spectroscope.

9. Method as claimed in claim 1, characterized in that at the beginning of the process a temperature of 30° C. up to 200° C. is set.

10. Method as claimed in claim 9, characterized in that the temperature is 80° C.

11. Method as claimed in claim 1, characterized in that a pressure of 100 mbar is set.

12. Method as claimed in claim 1, characterized in that the solid compound is removed from the vacuum coating chamber by means of an extraction fitting connected to a pump.

13. Method as claimed in claim 12, characterized in that the solid compound formed is detached by means of ultrasound from the walls of the vacuum coating chamber before being removed from the vacuum coating chamber.

14. Method as claimed in claim 1, characterized in that the solid compound is removed from the vacuum coating chamber by means of a dust extractor.

15. Method as claimed in claim 14, characterized in that the solid compound formed is detached by means of ultrasound from the walls of the vacuum coating chamber before being removed from the vacuum coating chamber.

16. Method as claimed in claim 1, wherein the gas from the group of $N_2$, $O_2$ or air is introduced from at least one tank into the vacuum coating chamber.

17. Method as claimed in claim 1, wherein the gas is introduced into the vacuum coating chamber such that the gas exothermically reacts with the alkali- or alkaline earth-metals in the vacuum chamber and forms the solid compound.

18. Method as claimed in claim 1, wherein the gas from the group of $N_2$, $O_2$ or air is introduced into the vacuum coating chamber before opening the chamber.

19. Method for removing alkali- or alkaline earth-metals from a vacuum coating chamber of a coating installation, characterized by the following steps:
 a) the vacuum coating chamber is set under vacuum after the coating process has been completed and substrates have been removed from the coating chamber,
 b) then a gas selected from the group consisting of $N_2$, $O_2$ and air is introduced into the vacuum coating chamber such that the gas exothermically reacts with the alkali- or alkaline earth-metals in the vacuum coating chamber and forms a solid compound, and
 c) the solid compound is removed from the vacuum coating chamber.

20. Method as claimed in claim 19, wherein the gas from the group of $N_2$, $O_2$ or air is introduced from at least one tank into the vacuum coating chamber.

21. Method as claimed in claim 19, wherein the gas from the group of $N_2$, $O_2$ or air is introduced into the vacuum coating chamber before opening the chamber.

22. Method as claimed in claim 19, wherein the metal is lithium.

23. Method as claimed in claim 19, wherein the solid compound is removed in its solid state from the vacuum coating chamber.

24. Method as claimed in claim 19, wherein the solid compound is removed from the vacuum coating chamber by means of a dust extractor.

25. Method as claimed in claim 19, wherein the solid compound formed is detached by means of ultrasound from the walls of the vacuum coating chamber before being removed from the vacuum coating chamber.

* * * * *